United States Patent
Fang et al.

(10) Patent No.: US 7,496,884 B2
(45) Date of Patent: Feb. 24, 2009

(54) DISTRIBUTED HIERARCHICAL PARTITIONING FRAMEWORK FOR VERIFYING A SIMULATED WAFER IMAGE

(75) Inventors: Weiping Fang, Fremont, CA (US);
Huijuan Zhang, Cupertino, CA (US);
Yibing Wang, Sunnyvale, CA (US);
Zongwu Tang, Pleasanton, CA (US)

(73) Assignee: Synopsys, Inc., Mountain View, CA (US)

( * ) Notice: Subject to any disclaimer, the term of this patent is extended or adjusted under 35 U.S.C. 154(b) by 215 days.

(21) Appl. No.: 11/510,415

(22) Filed: Aug. 25, 2006

(65) Prior Publication Data
US 2007/0055953 A1    Mar. 8, 2007

Related U.S. Application Data

(60) Provisional application No. 60/713,640, filed on Sep. 2, 2005.

(51) Int. Cl.
*G06F 17/50* (2006.01)

(52) U.S. Cl. .................. 716/21; 716/4; 716/5; 716/19; 716/20; 430/5; 430/30

(58) Field of Classification Search ...................... 716/4, 716/5, 8–1, 19–21; 430/5, 30
See application file for complete search history.

(56) References Cited

U.S. PATENT DOCUMENTS

2006/0143589 A1 *   6/2006   Horng et al. .................. 716/19

* cited by examiner

*Primary Examiner*—Thuan Do
*Assistant Examiner*—Nghia M Doan
(74) *Attorney, Agent, or Firm*—Park, Vaughan & Fleming LLP

(57) ABSTRACT

A system that verifies a simulated wafer image against an intended design. During operation, the system receives a design. Next, the system generates a skeleton from the design, wherein the skeleton specifies cell placements and associated bounding boxes for the cell placements, but does not include geometries for the cell placements. The system then computes environments for cell placements based on the skeleton. Next, the system generates templates for cell placements, wherein a template for a cell placement specifies the cell placement and the environment surrounding the cell placement. The system then generates the simulated wafer image by performing model-based simulations for cell placements associated with unique templates.

15 Claims, 9 Drawing Sheets

DISTRIBUTED HIERARCHICAL PARTITIONING FRAMEWORK FOR VERIFYING A SIMULATED WAFER IMAGE

RELATED APPLICATION

This application hereby claims priority under 35 U.S.C. §119 to U.S. Provisional Patent Application No. 60/713,640 filed 02 Sep. 2005, entitled "Method of Data Partitioning Only on Hierarchy on Large Layout Files For Fast Lithography Verification of Design Intent Against Wafer Image," by inventors Weiping Fang, Huijuan Zhang, Yibing Wang, and Zongwu Tang.

BACKGROUND

1. Field of the Invention

The present invention relates to techniques for verifying an integrated circuit design. More specifically, the present invention relates to a method and apparatus for verifying a simulated wafer image against an intended design.

2. Related Art

As feature sizes on integrated circuit (IC) chips become smaller than the wavelength of light used to expose the features on the wafer, optical proximity correction (OPC) and other resolution enhancement techniques (RET) are being used to ensure that the mask patterns produce the intended design on the wafer. As RET techniques become more aggressive, the task of verifying the accuracy of the final pattern on the wafer becomes too complex for simple Design Rule Checking (DRC) techniques. Instead, Lithography Rule Checking (LRC) techniques are used to physically verify complex RET mask patterns. LRC techniques use model-based simulations of the mask patterns to produce a simulated physical layout of the structures fabricated on the wafer. The simulated physical structures are then compared against the intended design (i.e., target pattern).

For example, one LRC technique uses MERGE_TOP flow in the Synopsys SiVL® product. (Synopsys SiVL is a registered trademark of Synopsys, Inc. of Mountain View, Calif.) In MERGE_TOP flow, the target pattern data (i.e., pre-OPC data) and the mask pattern data (i.e., post-OPC data) are merged into a single hierarchy in which one branch is the full pre-OPC data and the other branch is the full post-OPC data. A single top cell is created, which is the parent of the top cell of the pre-OPC data and the top cell of the post-OPC data. The data in both the target pattern and the mask pattern are then fed into the SiVL flow and are traversed serially to partition the hierarchical layout of the full chip into multiple subsections, called "templates." A template is a cell placement with unique context within the environment of the cell placement. The templates are then distributed across multiple computing nodes in a distributed processing environment to perform model-based simulations on the post-OPC mask patterns in parallel. The pre-OPC layout provided by designers is then compared against the model-based simulations of the post-OPC layout to determine if the post-OPC layout produces the intended design.

Unfortunately, the serial process involved in data partitioning is extremely time-consuming and limits the performance of the whole verification flow. Hence, what is needed is a method and an apparatus for verifying a simulated wafer image against an intended design without these performance problems.

SUMMARY

One embodiment of the present invention provides a system that verifies a simulated wafer image against an intended design. During operation, the system receives a design. Next, the system generates a skeleton from the design, wherein the skeleton specifies cell placements and associated bounding boxes for the cell placements, but does not include geometries for the cell placements. The system then computes environments for cell placements based on the skeleton. Next, the system generates templates for cell placements, wherein a template for a cell placement specifies the cell placement and the environment surrounding the cell placement. The system then generates the simulated wafer image by performing model-based simulations for cell placements associated with unique templates.

In a variation on this embodiment, while computing an environment for a given cell placement, the system uses information about bounding boxes for other cell placements in the design to determine whether the other cell placements overlap a bounding box or an associated ambit for the given cell placement. If so, the system includes other cell placements in the environment for the given cell placement.

In a variation on this embodiment, while generating templates for cell placements, for each cell, the system identifies placements of the cell with unique environments and then generates templates for placements with unique environments.

In a variation on this embodiment, prior to generating the simulated wafer image, the system groups templates that were generated from the same cell. For each template group, the system sends the template group to a computing node within a distributed processing environment to perform model-based simulations for cell placements associated with templates within the template group.

In a further variation, while performing model based simulations, for each template within a template group, the system performs the following steps. First, the system retrieves geometries for the template from the design. Next, the system computes a signature for the template based on the geometries within the template. The system then compares the signature for the template against signatures for previously-simulated templates to determine whether model based simulations have previously been performed on the geometries within the template. If so, the system discards the template. Otherwise, the system performs a model-based simulation on the geometries in the template.

In a variation on this embodiment, the system first reads geometry data from the design while generating the skeleton. Next, the system calculates bounding boxes for cell placements based on the geometry data. The system then discards the geometry data.

In a variation on this embodiment, the system compares the simulated wafer image against the intended design.

In a variation on this embodiment, the design is a post-optical-proximity-correction (post-OPC) layout.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer readable media now known or later developed.

ASIC Design Flow

Figure 1:
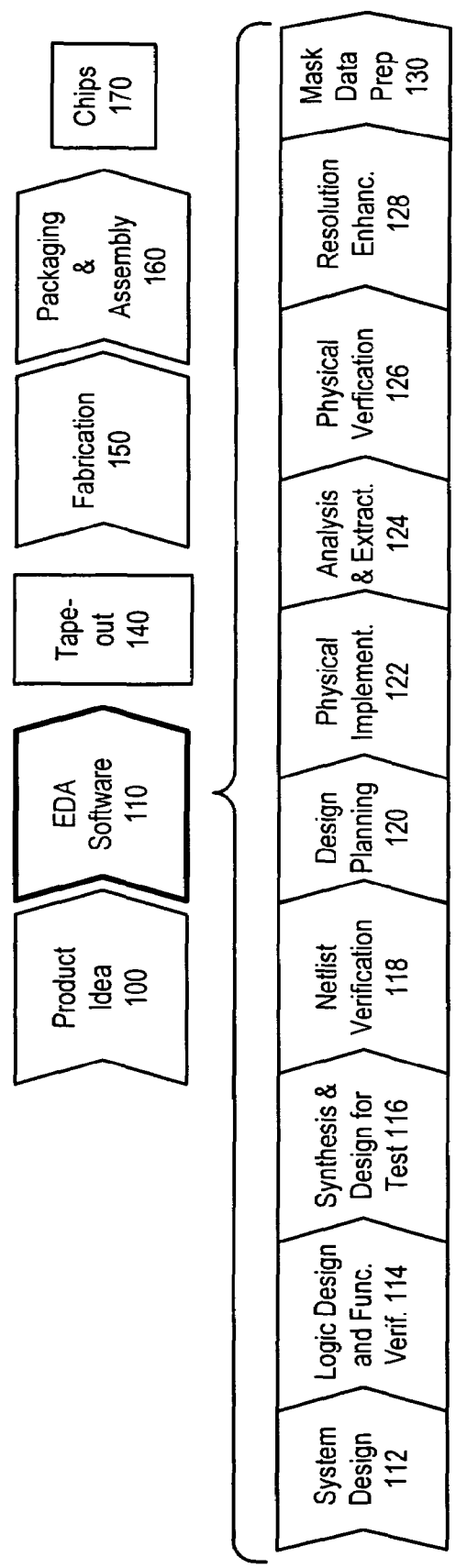
FIG. 1 illustrates a simplified representation of an exemplary digital ASIC design flow.

Before proceeding further with the description, it is helpful to place this process in context. FIG. 1 shows a simplified representation of an exemplary digital ASIC design flow. At a high level, the process starts with the product idea (step 100) and is realized in an EDA software design process (step 110). When the design is finalized, it can be taped-out (event 140). After tape out, the fabrication process (step 150) and packaging and assembly processes (step 160) occur resulting, ultimately, in finished chips (result 170).

The EDA software design process (step 110) is actually composed of a number of steps 112-130, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 110) is described below.

System design (step 112): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

Netlist verification (step 118): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 120): Here, an overall floorplan for the chip is constructed and analyzed for timing and top-level routing. Exemplary EDA software products from Synopsys, Inc. that can be used at this step include Astro and IC Compiler products.

Physical implementation (step 122): The placement (positioning of circuit elements) and routing (connection of the same) occurs at this step. Exemplary EDA software products from Synopsys, Inc. that can be used at this step include the Astro and IC Compiler products.

Analysis and extraction (step 124): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 126): At this step various checking functions are performed to ensure correctness for: manufacturing, electrical issues, lithographic issues, and circuitry. Exemplary EDA software products from Synopsys, Inc. that can be used at this step include the Hercules product.

Resolution enhancement (step 128): This step involves geometric manipulations of the layout to improve manufacturability of the design. Exemplary EDA software products from Synopsys, Inc. that can be used at this step include Proteus, ProteusAF, and PSMGen products. Note that the present invention is used after this step to verify a resolution-enhanced layout against an intended design.

Mask data preparation (step 130): This step provides the "tape-out" data for production of masks for lithographic use to produce finished chips. Exemplary EDA software products from Synopsys, Inc. that can be used at this step include the CATS® family of products.

Silicon-versus-Layout Verification

Figure 2:
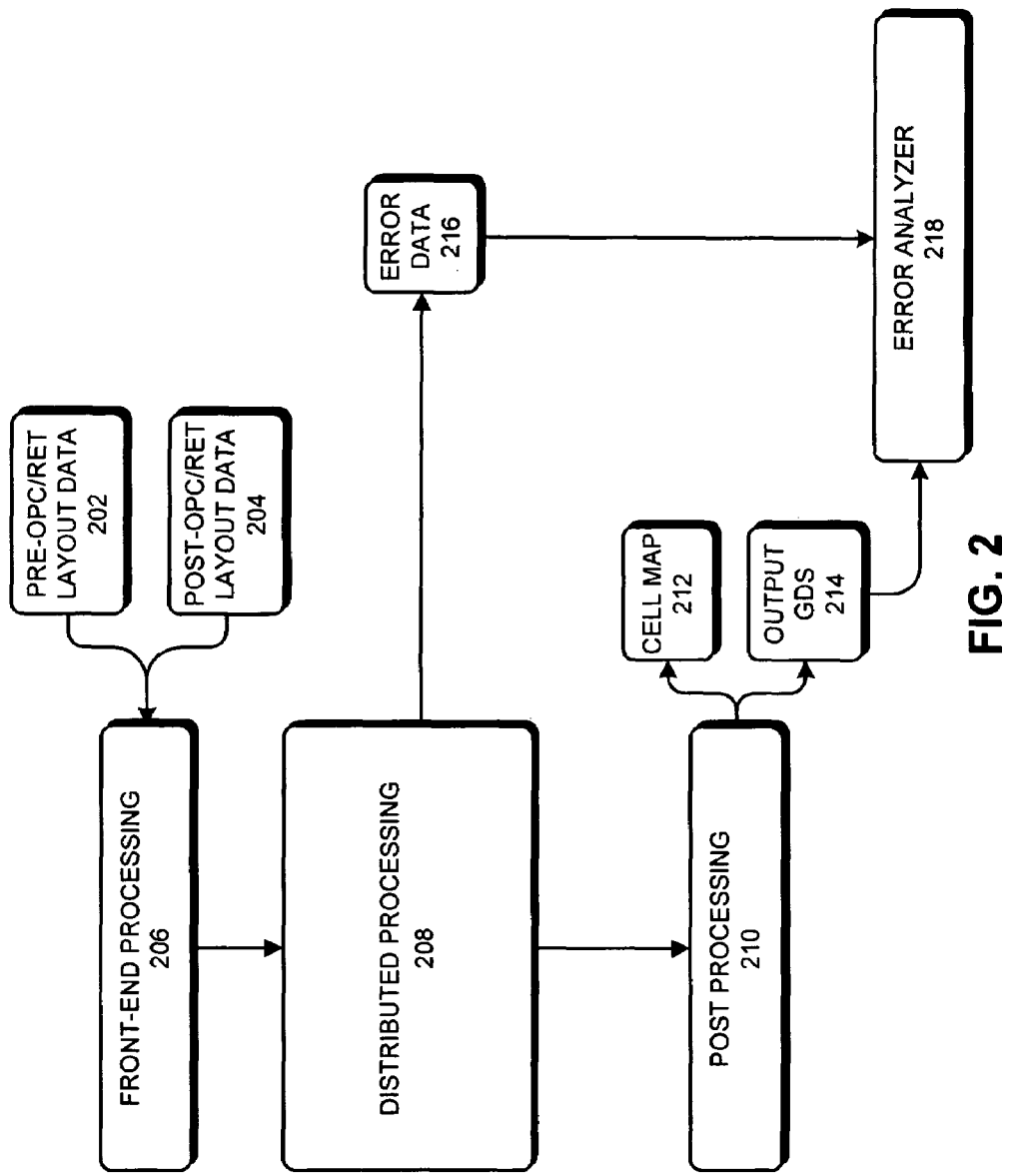
FIG. 2 presents a block diagram of a silicon-versus-layout verification flow in accordance with an embodiment of the present invention.

One embodiment of the present invention verifies that a post-OPC layout produces the intended design when fabricated on a wafer. This verification process is referred to as "silicon-versus-layout verification." FIG. 2 presents a block diagram of a silicon-versus-layout verification flow in accordance with an embodiment of the present invention. Note that the silicon-versus-layout flow is used after resolution enhancement (step 128) in FIG. 1. In FIG. 2, pre-OPC/RET layout data 202 and post-OPC/RET layout data 204 is fed into front-end processing module 206. In one embodiment of the present invention, front-end processing module 206 generates a skeleton based on the post-OPC layout data 204. Note that a skeleton is a layout hierarchy which includes bounding box for each cell, but does not include any geometry data.

In one embodiment of the present invention, front-end processing module 206 partitions post-OPC/RET layout data 204 into subsets of the layout data (i.e., templates) based on the skeleton and sends the templates to distributed processing module 208. Distributed-processing module 208 prepares the templates for distributed processing and distributes the templates across a plurality of computing nodes within a distributed processing environment. Note that front-end processing module 206 and distributed-processing module 208 are described in detail below.

In one embodiment of the present invention, each computing node within the distributed processing environment performs model-based simulations on its subset of the layout data. The output of the model-based simulations is then sent to post-processing module 210 to create cell map 212 and output GDS file 214 of the simulated wafer image.

Output GDS file 214 and error data 216 is then fed into error analyzer module 218 to analyze any errors generated during the model-based simulations.

Skeleton Flow

The primary motivation of the present invention is to spend as little time as possible in the preprocessing stage, which is performed on a single computing node, and to push as much necessary work as possible to the distributed processing (DP) stage of a SiVL run.

In one embodiment of the present invention, SiVL preprocessing includes hierarchy preprocessing, group file creation and sorting, and the initial non-DP portion of template setup. Note that template setup refers to a process that identifies cell placements with unique environments and creates a template structure for those unique cell placements.

The creation of templates by preprocessing module 206 collects the context in the environment of each cell instance. Note that it is not necessary to preprocess the geometry data in both the pre-OPC layout and the post-OPC layout. Hence, a skeleton flow is used during the partitioning stage of template setup to improve the performance and scalability of the MERGE_TOP flow. More specifically, by looking only at the post-OPC skeleton, the data volume in the preprocessing stage is substantially reduced (e.g., by about 5×-10× depending on the design), and heavy I/O operations on post-OPC GDS data can be postponed to the DP stage, thus reducing turn around time for verification.

In one embodiment of the present invention, cell-to-cell relationships in the environment of a cell placement are abstracted and analyzed without using the details of post-OPC geometry data. In this embodiment, template count can go beyond the template count which would otherwise be generated during template setup using post-OPC geometry data from the post-OPC layout (i.e. GDS file). This effect is described in detail in reference to FIG. 7 below. One technique to counter the increased template count is to screen out identical templates after reading the post-OPC data at DP stage. This screening process is aided by grouping templates generated from the same cell together into template families.

In one embodiment of the present invention, bounding boxes for cells in the post-OPC layout is extracted to create a skeleton, and the geometry data in the post-OPC layout is indexed. In another embodiment of the present invention, at the distributed processing stage, a computing node uses the index as a reference to fetch geometry data from the post-OPC layout to fulfill subsequent processing.

Figure 3:
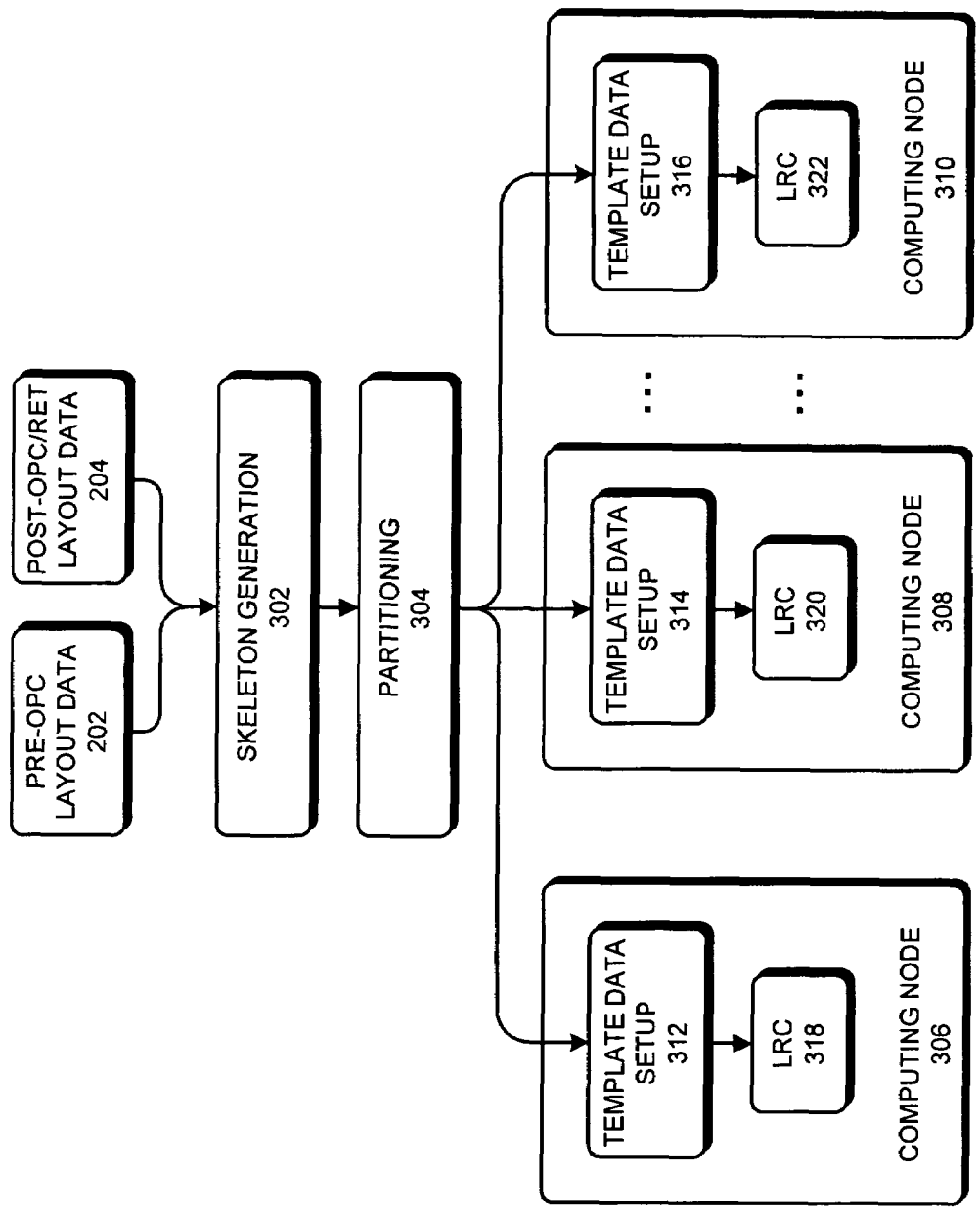
FIG. 3 presents a block diagram of a skeleton flow in accordance with an embodiment of the present invention.

In one embodiment of the present invention, the skeleton flow includes the steps of: skeleton generation, partitioning (i.e., templatization), and template data setup. FIG. 3 presents a block diagram of a skeleton flow in accordance with an embodiment of the present invention. At the start of the block diagram, pre-OPC layout data 302 and post-OPC layout data 304 are fed into skeleton generation module 302. Next, skeleton-generation module 302 generates; a skeleton of the post-OPC data 302. (Note that skeleton-generation module 302 is discussed in more detail in reference to FIG. 5 below.)

The skeleton of post-OPC layout data 202 is then fed into partitioning module 304, which generates templates for cell placements. (Partitioning module 304 is discussed in more detail below in reference to FIGS. 8-9 below.) In one embodiment of the present invention, the template for a cell placement specifies the cell placement and the environment surrounding the cell placement. The templates are then grouped and sent to computing nodes 306-310 within a distributed processing environment. Note that although only three computing nodes are shown, the distributed processing environment can include more computing nodes or less computing nodes.

Computing nodes 306-310 each include template data setup modules 312-316, and lithography rule checking (LRC) modules 318-322, respectively. Template data setup modules 312-316 prepare the templates to be simulated by LRC modules 318-322, respectively. Note that template data setup modules 312-316 are discussed in more detail in reference to FIG. 10 below.

Figure 4:
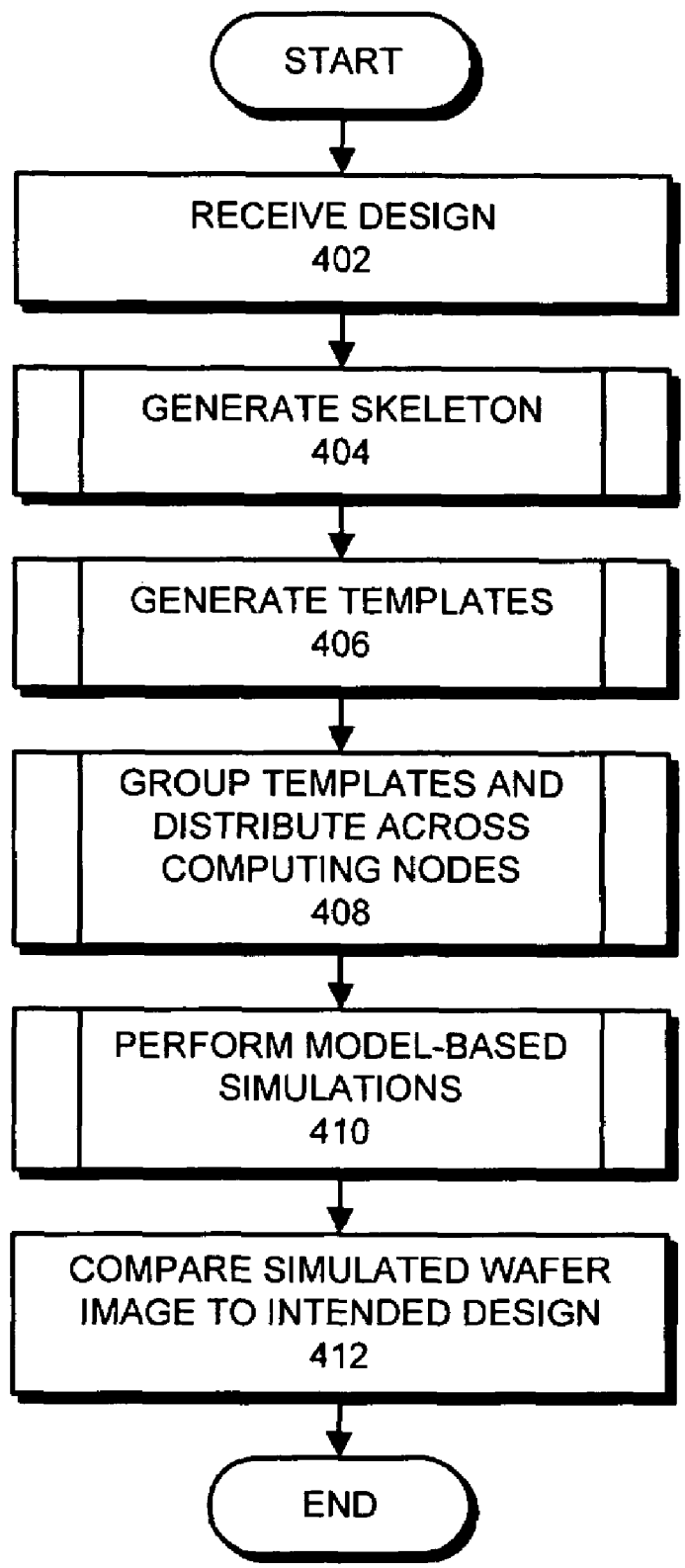
FIG. 4 presents a flow chart illustrating the process of verifying a simulated wafer image against an intended design using the skeleton flow in accordance with an embodiment of the present invention.

FIG. 4 presents a flow chart illustrating the process of verifying a simulated wafer image against an intended design using the skeleton flow in accordance with an embodiment of the present invention. The process begins when the system receives a design (step 402). Next, the system generates a skeleton from the design, wherein the skeleton specifies cell placements and associated bounding boxes for the cell placements, but does not include geometries for the cell placements (step 404). Note that the skeleton generation process is discussed in more detail in reference to FIG. 5 below. The system then generates templates based on the skeleton (step 406), which is discussed in more detail with reference to FIG. 8 below.

Next, the system groups the templates and distributes the grouped templates to computing nodes within the distributed processing environment (step 408). This process is discussed in more detail with reference to FIG. 9 below. At each computing node, the system performs model-based simulations on the templates sent to the computing node to generate a simulated wafer image (step 410), which is discussed in further detail with reference to FIG. 10 below. After the model-based simulations are completed, the system compares the simulated wafer image against the intended design to determine whether the design, when fabricated on a wafer, produces the intended design (step 212).

Skeleton Generation

In one embodiment of the present invention, instead of having a Graphic Data System (GDS) file that has a top cell, one branch for the full pre-OPC data, and the other branch for the full post-OPC data, the input GDS file contains a "merged top cell" and one branch for the full pre-OPC data and the other branch for post-OPC skeleton.

In one embodiment of the present invention, the post-OPC hierarchy remains unchanged during hierarchy preprocessing, and the post-OPC skeleton inherits that hierarchy.

In one embodiment of the present invention, the post-OPC skeleton includes bounding boxes of geometries on each post-OPC layer for each cell, but does not contain detailed geometry data for the cells. In another embodiment of the present invention, an offset file that records the position of each post-OPC cell in the post-OPC GDS file is generated when post-OPC skeleton is created. When reading the post-OPC data at DP stage, the system uses the offset file to quickly locate the position of a given cell's post-OPC data in the post-OPC GDS file.

In one embodiment of the present invention, the post-OPC GDS file, the merged GDS file, and the offset file are placed on a network disk so that they are accessible from all computing nodes at DP stage.

Figure 5:
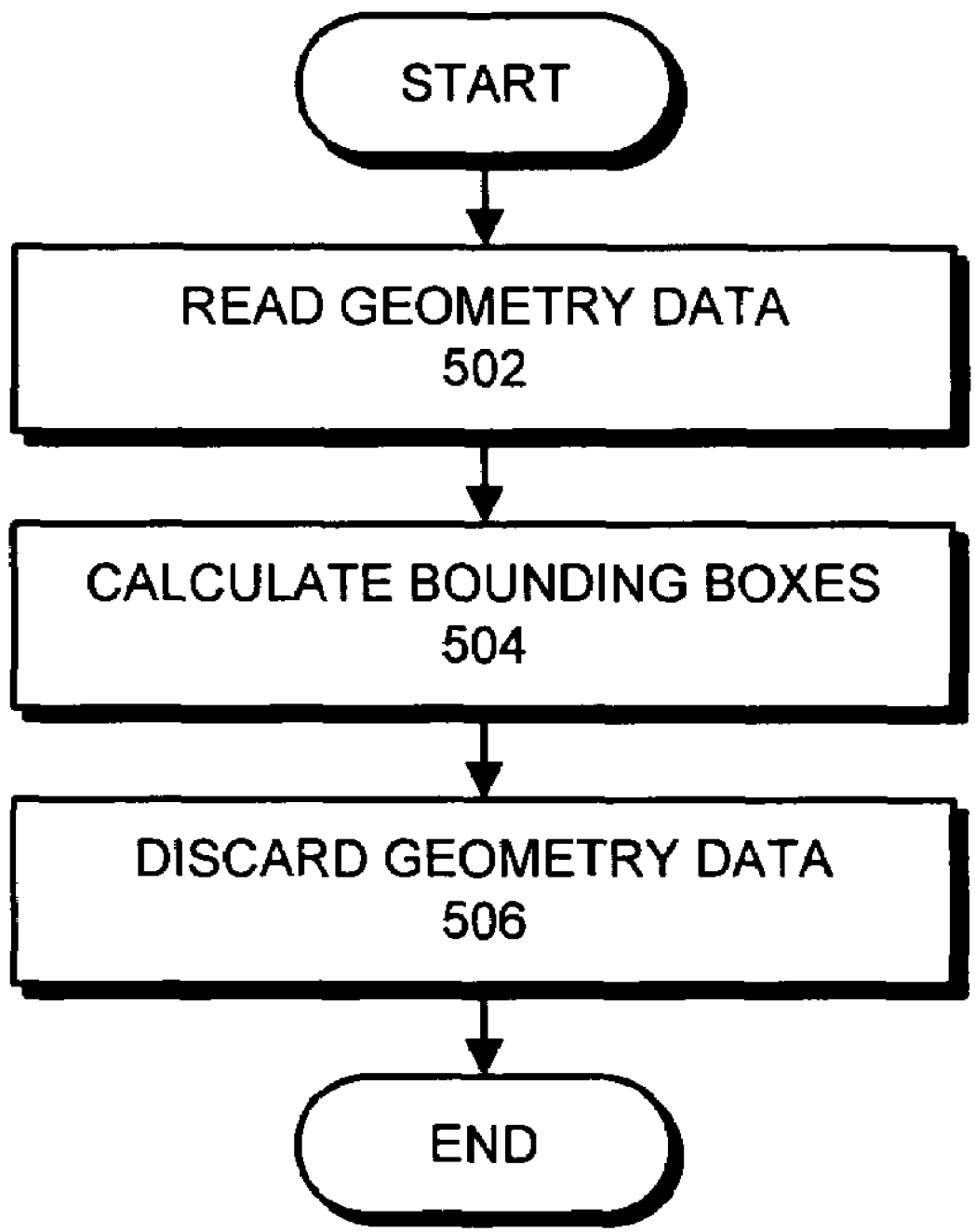
FIG. 5 presents a flow chart illustrating the process of generating a skeleton in accordance with an embodiment of the present invention.

FIG. 5 presents a flow chart illustrating the process of generating a skeleton in accordance with an embodiment of the present invention. The process begins when the system reads geometry data from the design (step 502). In one embodiment of the present invention, the system reads the geometry data from the post-OPC layout. Next, the system calculates bounding boxes of cell placements based on the geometry data (step 504). The system then discards the geometry data (506), leaving only bounding boxes in the skeleton.

Note that due to the reduced size of the input GDS file, the system achieves at preprocessing stage a speedup in templates setup and a reduction in I/O overhead.

Cell Placements and Environments

Figure 6:
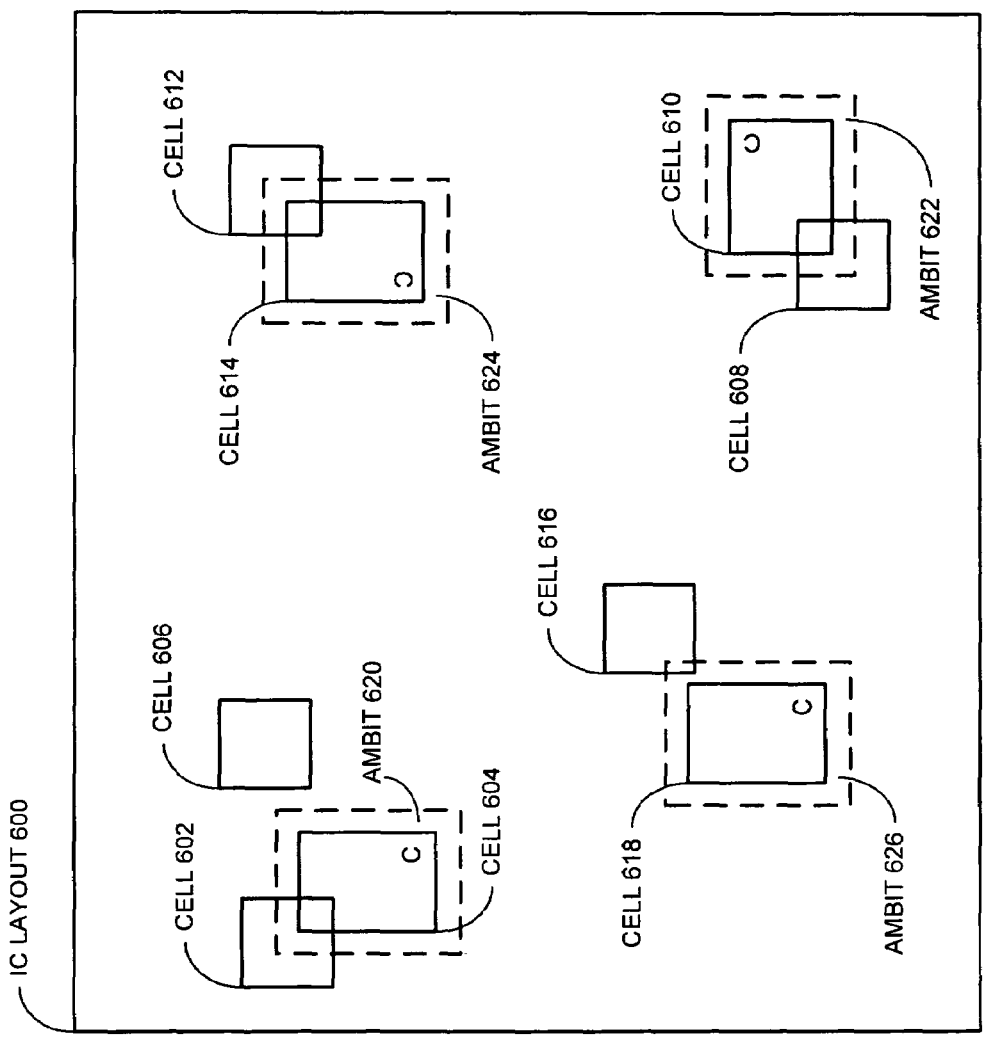
FIG. 6 presents a block diagram of an integrated circuit layout illustrating the template-generation phase in accordance with an embodiment of the present invention.

FIG. 6 presents an exemplary block diagram of integrated circuit (IC) layout 600, which includes cells 602-618, which illustrate the template-generation phase in accordance with an embodiment of the present invention. More specifically, in FIG. 6, the system is generating templates for cells 604, 610, 614, and 618. Ambits 620, 622, 624, and 626 are specified areas surrounding cells 604, 610, 614, and 618, respectively. In one embodiment of the present invention, the ambits for cells are specified by user-defined parameters. In this exemplary layout, cells 604, 610, 614, and 618 are different placements of the same cell. Also note that cells 602, 606, 608, 612, and 616 are different placements of the same cell.

In this example, the system starts by calculating an environment for cell 604. As depicted in FIG. 6, cell 602 is within ambit 620 of cell 604, but cell 606 is not. Hence, when the system computes the environment for cell 604, the system includes cell 602 in the environment, but does not include cell 606.

Next, the system computes an environment for cell 610. Note that the system does not need to compute the environment for cells in any specific order. For example, the system can calculate the environment for cells 602 and 606 prior to computing the environments for cell 610. Also, in this example, cells 608 and 610 are in the same relative placements to each other as cells 602 and 604, but are rotated by 90 degrees counterclockwise with respect to cells 602 and 604. Since no other cell placements are within ambits 620 and 622, the environments for cells 604 and 610 are the same.

Cells 612 and 614 are in the same relative positions to each other as cells 602 and 604, but are mirrored about the vertical axis with respect to cells 602 and 604. Hence, the environment for cell 604 is different than the environment for cell 614.

Cell 618 does not have the same environment as cell 604 because the portion of cell 616 that overlaps ambit 626 is not the same as the portion of cell 602 that overlaps ambit 620. Similarly, cell 618 does not have the same environment as cell 614 because the portion of cell 616 that overlaps ambit 626 is not the same as the portion of cell 612 that overlaps ambit 624.

One embodiment of the present invention generates templates for cells with unique environments. In this example, the system generates unique templates for cells 604, 614, and 618 only.

Figure 7:
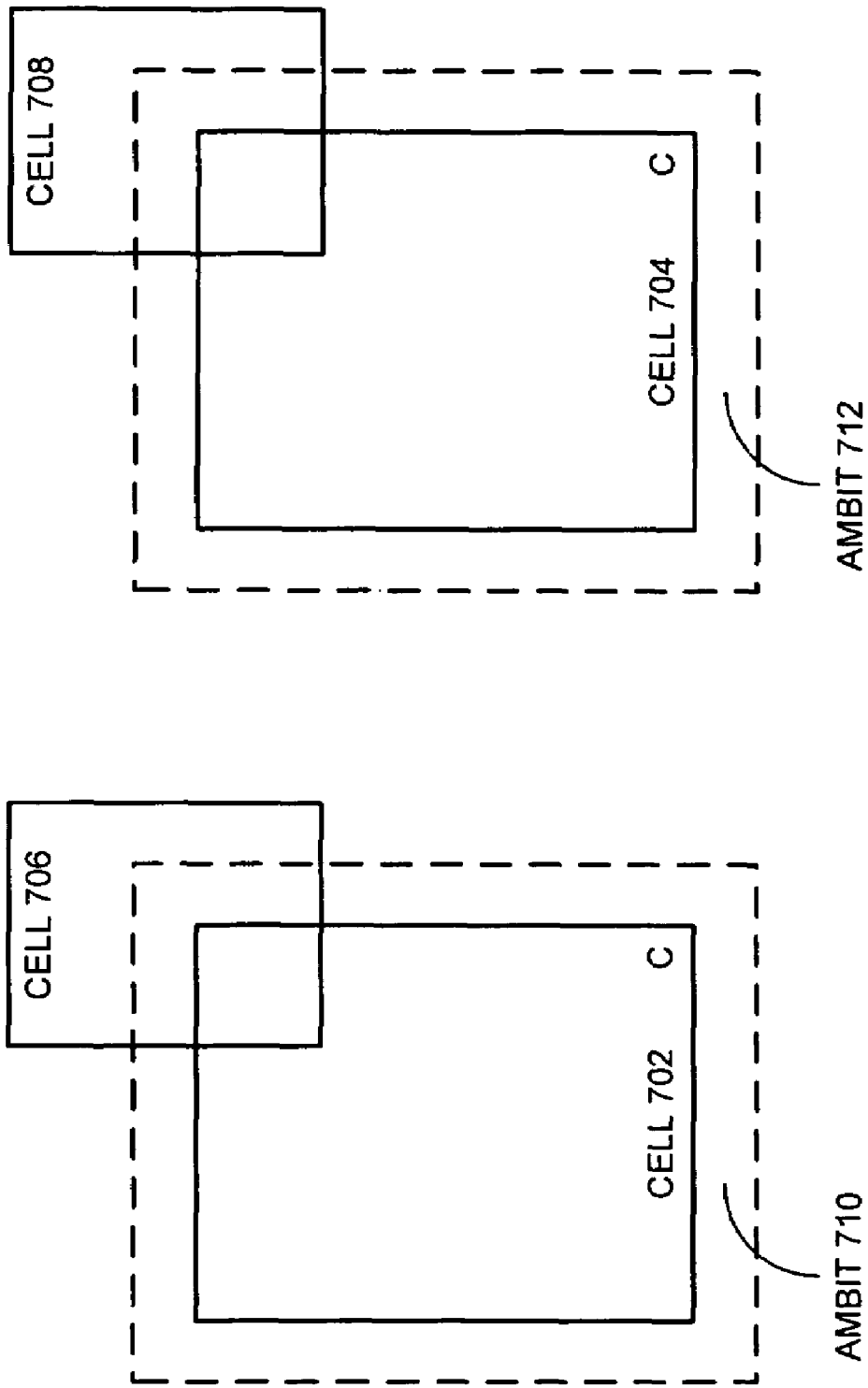
FIG. 7 presents a block diagram of cell placements in accordance with an embodiment of the present invention.

FIG. 7 presents a block diagram of cell placements 702-708 in accordance with an embodiment of the present invention. In FIG. 7, ambits 710 for cell 702 and ambit 712 for cell 704 are shown. In this example, cells 702 and 704 are two placements of the same cell and ambits 710 and 712 enclose the same amount of area around cells 702 and 704, respectively. In this example, cells 706 and 708 are different cells. However, even though cells 706 and 708 are different, the portion of cell 706 within ambit 710 and the portion of cell 708 within ambit 712 can be the same. For example, cells 706 and 708 can share the same geometry data for the portions of the cells within ambits 710 and 712. In this case, the environment for cells 702 and 704 are the same. Since the system does not have geometry data for cells 702-708, during the template generation stage, the system cannot determine that the environment for cell 702 and cell 704 are the same. Hence, more templates than necessary may be generated.

To address this problem, in one embodiment of the present invention, during the DP stage, the system uses the actual geometries for the cells to generate a signature of the environment for each cell processed on the computing node and only performs model-based simulations for those cells with unique signatures. This process is discussed in more detail in reference to FIG. 10 below.

Partitioning

One embodiment of the present invention identifies cell placements with unique environments and assigns a template to these cell placements. Note that this process is referred to as "templatization" or template setup. The goal during the partitioning stage is to have cell placements with the same environment represented by the same template. In one embodiment of the present invention, post-OPC data is no longer available during partitioning. In this embodiment, instead of looking at geometries in the environment of a cell placement to determine the uniqueness of a template, the post-OPC skeleton is analyzed to determine which post-OPC cells are in the environment of a cell placement and to determine the orientation of those cells relative to the cell placement.

In one embodiment of the present invention, to quickly determine which geometries are in the environment of a given cell placement, a special pattern-matching technique matches a cell placement in the environment. In this embodiment, a cell placement is uniquely represented by a cell number and a relative transformation (i.e., a point (x, y) and an orientation of a cell placement).

Figure 8:
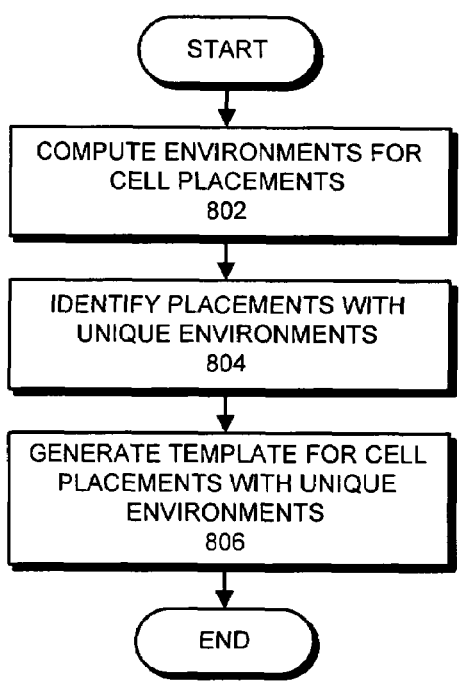
FIG. 8 presents a flow chart illustrating the process of generating template cells in accordance with an embodiment of the present invention.

FIG. 8 presents a flow chart illustrating the process of generating template cells in accordance with an embodiment of the present invention. The process begins when the system computes environments for cell placements (step 802). In doing so, the system uses bounding boxes of other cell placements in the design to determine whether the other cell placements overlap a bounding box or an associated ambit for the given cell placement. If so, the system includes those cell placements that overlap the bounding box and the associated ambit for the given cell placement in the environment for the given cell placement.

Next, for each cell, the system (1) identifies placements of the cell with unique environments (step 804), and (2) generates templates for placements of the cell with unique environments (step 806).

Figure 9:
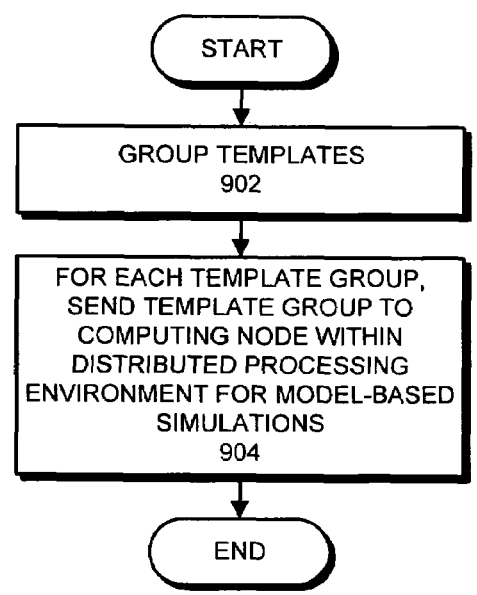
FIG. 9 presents a flow chart illustrating the process of distributing templates to computing nodes within a distributed processing environment in accordance with an embodiment of the present invention.

In one embodiment of the present invention, after the templates have been generated, the templates are distributed to computing nodes within the distributed environment. FIG. 9 presents a flow chart illustrating the process of distributing templates to computing nodes within a distributed processing environment in accordance with an embodiment of the present invention. The process begins when the system groups templates that were generated from the same cell (step 902). For each template group (also referred to as a "template family"), the system sends the template group to a computing node within a distributed processing environment to perform model-based simulations for cell placements associated with templates within the template group (step 904).

Template Data Setup

One embodiment of the present invention shifts the burden of reading large GDS files to the DP stage wherein a plurality of computing nodes is used to process the GDS data.

In one embodiment of the present invention, during the template data setup stage, data on main layers as well as on context layers of the original (pre-OPC) cells are read from pre-OPC GDS file into the template cells. Data on context layers of the post-OPC cells is read from the post-OPC GDS file based on cell offset obtained during the skeleton-generation stage.

As discussed in reference to FIG. 7, the templatization process may generate more templates than necessary. To address this problem, one embodiment of the present invention determines whether a template is identical to a previously-simulated template in the same template family. This process is described in more detail in reference to FIG. 10 below. Note that a template family is a group of templates based on the same cell.

Figure 10:
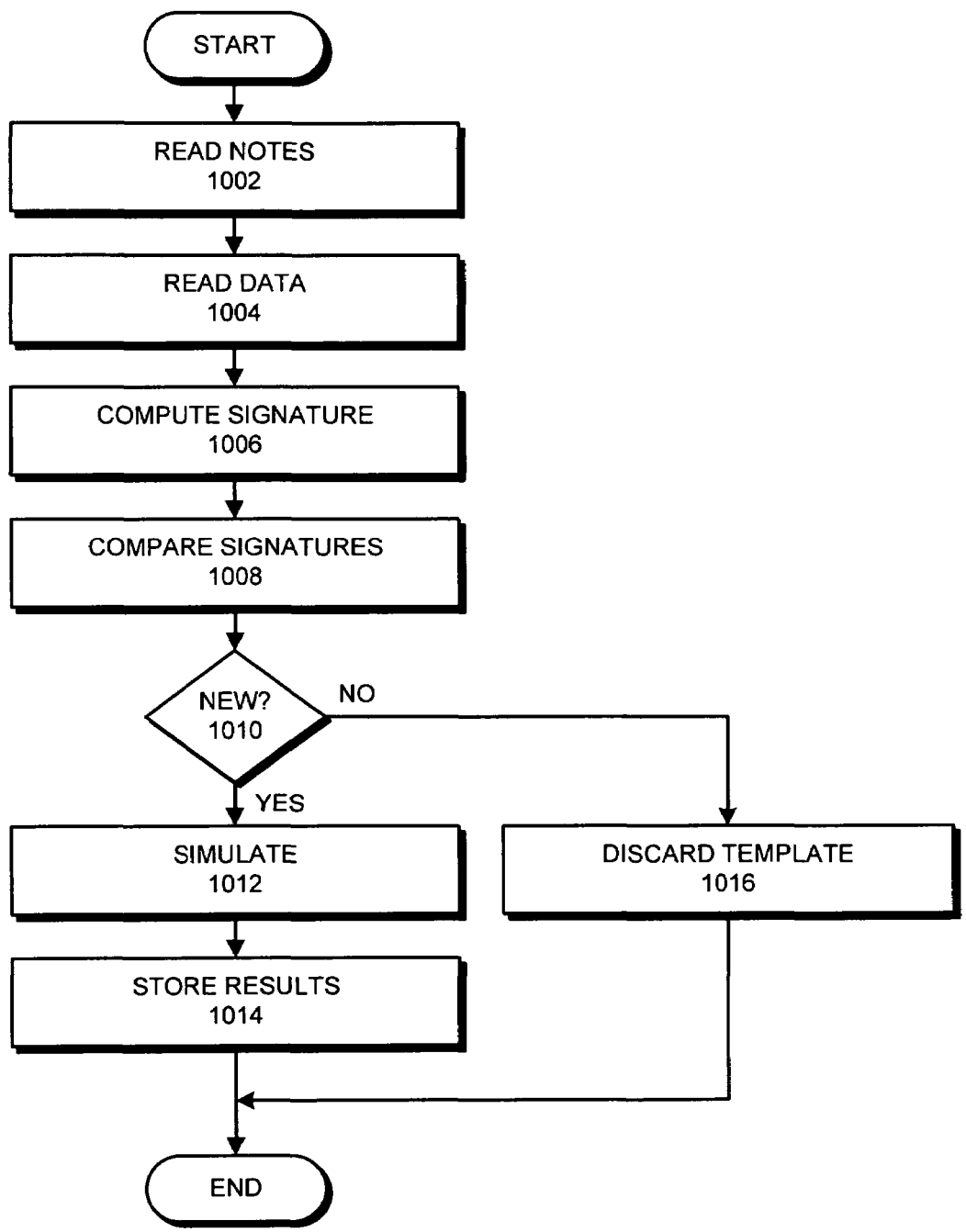
FIG. 10 presents a flow chart illustrating the process of performing model-based simulations for a template in accordance with an embodiment of the present invention.

FIG. 10 presents a flow chart illustrating the process of performing model-based simulations for a template in accordance with an embodiment of the present invention. The process begins when the system reads notes generated during the skeleton generation stage (step 1002). In one embodiment of the present invention, the notes include information stored in the offset file. Next, the system reads the geometry data for the template (step 1004). The system then computes a signature for the template based on the geometry data for the cells within the template (step 1006) and compares the signature for the template against signatures for previously-simulated templates to determine whether model-based simulations have previously been performed on the geometries within the template (step 1008).

If the model-based simulations have not been previously performed on the geometries within the template (step 1010—yes), the system performs model-based simulation on the geometries in the template (step 1012). The system then stores the results of the simulation and the signature for the template (step 1014).

If the model-based simulations have been previously performed on the geometries within the template (step 1010—no), the system discards the template and does not perform model-based simulation on the template (step 1016).

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for verifying a simulated wafer image against an intended design, comprising:

receiving a design which comprises one or more cell placements, wherein each of the cell placements comprises a set of geometries;

generating a skeleton from the design, wherein the skeleton is a layout hierarchy which includes a bounding box for each cell placement, but does not include the geometries associated with the cell placements;

computing environments for the cell placements based on the skeleton;

generating templates for the cell placements, which involves:

for each cell,
identifying placements of the cell associated with unique environments; and
generating templates for the placements associated with the unique environments;

grouping templates that were generated from the same cell to form one or more template groups;

generating the simulated wafer image by performing model-based simulations, which involves:

for each template within a template group,
retrieving geometries for the template from the design;
computing a signature for the template based on the geometries within the template;
comparing the signature for the template against signatures for previously-simulated templates to determine whether model-based simulations have previously been performed on the geometries within the template;
if so, discarding the template; and
otherwise, performing a model-based simulation on the geometries in the template.

2. The method of claim 1, wherein computing an environment for a given cell placement involves:

using information about bounding boxes for other cell placements in the design to determine whether the other cell placements overlap a bounding box or an associated ambit for the given cell placement; and if so, including other cell placements that overlap the bounding box and the associated ambit for the given cell placement in the environment for the given cell placement.

3. The method of claim 1, wherein prior to generating the simulated wafer image, the method farther comprises:

for each template group, sending the template group to a computing node within a distributed processing environment to perform model-based simulations for cell placements associated with templates within the template group.

4. The method of claim 1, wherein generating the skeleton from the design involves:
reading geometry data of the set of geometries associated with each of the cell placements from the design;
calculating bounding boxes for the cell placements based on the geometry data; and
discarding the geometry data.

5. The method of claim 1, further comprising comparing the simulated wafer image against the intended design.

6. The method of claim 1, wherein the design is a post-optical-proximity-correction (post-OPC) layout.

7. A computer-readable storage medium storing instructions that when executed by a computer cause the computer to perform a method for verifying a simulated wafer image against an intended design, wherein the method comprises:
receiving a design which comprises one or more cell placements, wherein each of the cell placements comprises a set of geometries;
generating a skeleton from the design, wherein the skeleton is a layout hierarchy which includes a bounding box for each cell placement, but does not include the geometries associated with the cell placements;
computing environments for the cell placements based on the skeleton; generating templates for the cell placements, which involves:
for each cell,
identifying placements of the cell associated with unique environments; and
generating templates for the placements associated with the unique environments
grouping templates that were generated from the same cell to form one or more template groups;
generating the simulated wafer image by performing model-based Simulations, which involves:
for each template within a template group,
retrieving geometries for the template from the design;
computing a signature for the template based on the geometries within the template;
comparing the signature for the template against signatures for previously-simulated templates to determine whether model-based simulations have previously been performed on the geometries within the template;
if so, discarding the template; and
otherwise, performing a model-based simulation on the geometries in the template.

8. The computer-readable storage medium of claim 7, wherein computing an environment for a given cell placement involves:
using information about bounding boxes for other cell placements in the design to determine whether the other cell placements overlap a bounding box or an associated ambit for the given cell placement; and
if so, including other cell placements that overlap the bounding box and the associated ambit for the given cell placement in the environment for the given cell placement.

9. The computer-readable storage medium of claim 7, wherein prior to generating the simulated wafer image, the method further comprises:
for each template group, sending the template group to a computing node within a distributed processing environment to perform model-based simulations for cell placements associated with templates within the template group.

10. The computer-readable storage medium of claim 7, wherein generating the skeleton from the design involves:
reading geometry data of the set of geometries associated with each of the cell placements from the design;
calculating bounding boxes for the cell placements based on the geometry data; and
discarding the geometry data.

11. The computer-readable storage medium of claim 7, wherein the method further comprises comparing the simulated wafer image against the intended design.

12. The computer-readable storage medium of claim 7, wherein the design is a post-optical-proximity-correction (post-OPC) layout.

13. An apparatus that verifies a simulated wafer image against an intended design, comprising:
a receiving mechanism configured to receive a design which comprises one or more cell placements, wherein each of the cell placements comprises a set of geometries;
a skeleton-generation mechanism configured to generate a skeleton from the design, wherein the skeleton is a layout hierarchy which includes a bounding box for each cell placement, but does not include the geometries associated with the cell placements;
an environment-computation mechanism configured to compute environments for the cell placements based on the skeleton;
a template-generation mechanism configured to generate templates for the cell placements, wherein the template-generation mechanism is configured to:
for each cell,
identify placements of the cell associated with unique environments; and
generate templates for the placements associated with the unique environments;
a grouping mechanism configured to group templates that were generated from the same cell to form one or more template groups;
a simulation mechanism configured to generate the simulated wafer image by performing model-based simulations, wherein the simulation mechanism is configured to:
for each template within a template group,
retrieve geometries for the template from the design;
compute a signature for the template based on the geometries within the template;
compare the signature for the template against signatures for previously-simulated templates to determine whether model-based simulations have previously been performed on the geometries within the template;
if so, discard the template; and
otherwise, perform a model-based simulation on the geometries in the template.

14. The apparatus of claim 13, wherein while computing an environment for a given cell placement, the environment-computation mechanism is configured to:
use information about bounding boxes for other cell placements in the design to determine whether the other cell placements overlap a bounding box or an associated ambit for the given cell placement; and if so, to include other cell placements that overlap the bounding box and the associated ambit for the given cell placement in the environment for the given cell placement.

15. The apparatus of claim 13, wherein prior to generating the simulated wafer image, the template-grouping mechanism is configured to:

for each template group, send the template group to a computing node within a distributed processing environment to perform model-based simulations for cell placements associated with templates within the template group.

* * * * *